FEEDBACK LIMITER CIRCUIT HAVING VOLTAGE GAIN AMPLIFIER

Filed Oct. 22, 1965

2 Sheets-Sheet 1

INVENTORS
GAVINO A. SPAMPANATO
BY RONALD W. EMBLEY
Allan Ratner

INVENTORS
GAVINO A. SPAMPANATO
RONALD W. EMBLEY
Allan Ratner

United States Patent Office 3,393,369

Patented July 16, 1968

3,393,369

FEEDBACK LIMITER CIRCUIT HAVING VOLTAGE GAIN AMPLIFIER

Ronald W. Embley, Ocean County, and Gavino A. Spampanato, Monmouth County, N.J., assignors to Electronic Associates, Inc., Long Branch, N.J., a corporation of New Jersey Filed Oct. 22, 1965, Ser. No. 501,831
8 Claims. (Cl. 328—142)

ABSTRACT OF THE DISCLOSURE

A direct coupled amplifier having a feedback limiter circuit which includes in series circuit resistance means, a voltage gain amplifier, and a limiter diode. A source of supply is connected to the limiter circuit for setting a predetermined limiting value. The limiter diode is turned OFF when the output voltage of the direct coupled amplifier is below the limiting value. When that output voltage reaches the limiting value the diode is turned ON and the impedance of the feedback circuit reduces in value to provide a gain for the direct coupled amplifier which approaches zero as a limit to prevent the output voltage from increasing.

This invention relates to a limiter circuit and more particularly to provide an output voltage which is limited to a substantially precise value.

Limiter circuits have been used for many purposes in the prior art and have been effective to limit an output voltage to a predetermined maximum or limiting value as the input voltage increases. At output voltages below the limiting value the limiter circuit is quiescent and does not operate on that output voltage. However, when the output voltage reaches the predetermined limiting value the limiter circuit is operative, as for example by the turning ON of a diode, to prevent the output voltage from increasing beyond that value.

High quality limiter circuits have been used for analog computation purposes and may comprise an operational amplifier including a feedback resistor connected in parallel with a feedback limiter circuit. The feedback limiter circuit includes a series limiter diode which is turned OFF below the desired limiting value so that the only feedback element for the operational amplifier is the feedback resistor. Thus, the output of the operational amplifier is determined solely by the gain of the amplifier. When the output of the amplifier reaches the predetermined limiting value the diode is turned ON reducing to zero as a limit the effective dynamic feedback impedance of the amplifier and thus the gain of the amplifier or the slope of its gain curve approach zero as a limit. Thus, from and after the limited value the output voltage remains substantially constant for further increases in input voltages. However such prior feedback limiter circuits include resistance elements which determine the quiescent current load on the operational amplifier. If the resistance elements have too small a resistance value then there will be too great a current demand on the operational amplifier. On the other hand if the value of such resistance is too large, when the limiter diode is turned ON, the effective feedback resistance does not approach zero as a limit and the slope of the gain curve is not zero. Thus, as the input voltage increases the output voltage also increases thereby to substantially decrease the accuracy of the limiter.

Accordingly, an object of the present invention is a limiter circuit having an amplifier in which at a predetermined limiting value of the output voltage the gain of the amplifier approaches zero as a limit.

Another object of the present invention is a limiter circuit having an amplifier in which its effective feedback impedance is reduced to zero as a limit when the output voltage of the amplifier reaches a predetermined limiting value.

In accordance with the present invention there is provided a limiter circuit for preventing an output voltage from increasing beyond a predetermined limiting value as the input voltage increases in value. Input voltage is applied to an input terminal of the limiter circuit and the output voltage is produced at an output terminal of the limiter circuit. A direct coupled operational amplifier has an input impedance connected between its input and the input terminal of the limiter circuit and has its output connected to the output terminal. The operational amplifier has two feedback paths connected between the output terminal and the amplifier input. A first of the feedback paths is a conventional feedback resistor and the second of the paths is a feedback limiter circuit including in series circuit relation a voltage divider, a voltage gain direct coupled amplifier and a limiter diode. Below a predetermined limiting value the limiter diode is turned OFF so that the normal feedback resistor is the only feedback element of the operational amplifier. At the limiting value, the limiting diode is turned ON and the voltage gain amplifier is effective to amplify the potential at the output terminal so that the effective dynamic impedance of the feedback limiter circuit has a value of zero after limit. In this manner the total effective feedback impedance of the operational amplifier has a magnitude of zero as a limit and thus the gain of the amplifier approaches zero as a limit. In this manner as the input voltage increases the output voltage remains substantially constant at its predetermined maximum or limited value.

For further objects and advantages of the invention and for typical embodiments thereof, reference is to be had to the following description taken in conjunction with the accompanying drawings, in which:

FIG. 1 schematically illustrates a limiter circuit embodying the invention;

Figure 1:
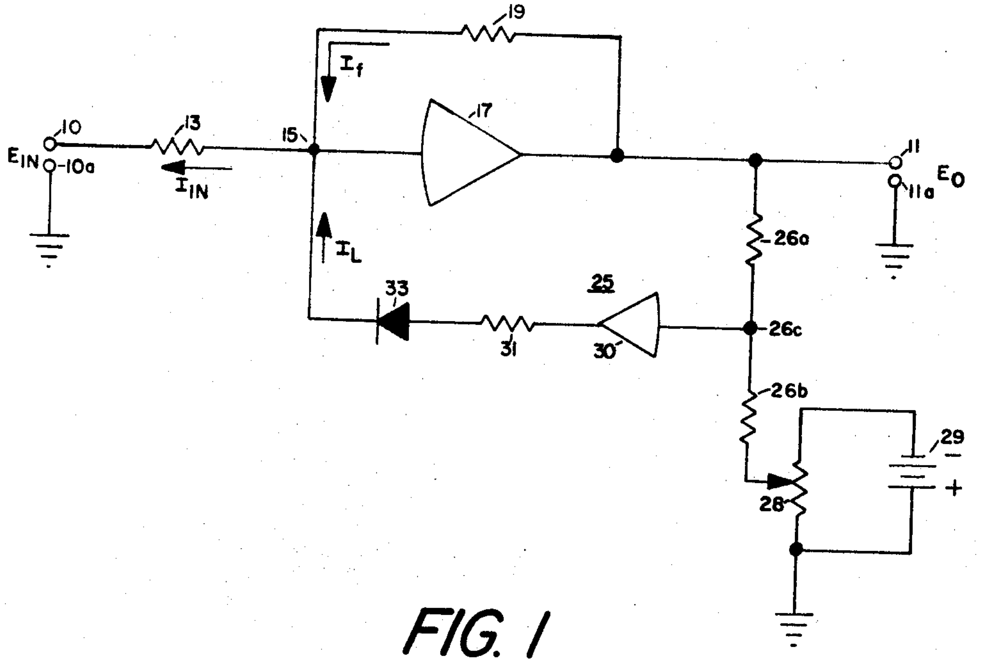
FIG. 1A illustrates an equivalent circuit of a feedback limiter circuit used in FIG. 1.
FIG. 1B illustrates an equivalent circuit of a feedback limiter circuit as used in the prior art.

Referring now to FIG. 1 there is shown a limiter circuit in which input signals $E_{IN}$ are applied to input terminal 10 with respect to a grounded input terminal **10*a* and output signals $E_0$ are produced at output terminal 11 with respect to a grounded output terminal 11*a*. From input terminal 10, the input signals $E_{IN}$ are conducted by way of an input resistor 13 to an input or summing junction 15 of a direct coupled stabilized amplifier 17**. Direct coupled stabilized amplifiers which provide an inverted output are commonly called operational amplifiers and are described for example in Patents Nos. 2,968,005 and 3,081,435 and also in the text Basics of Analog Computers by Truitt and Rogers, Rider, New York, 1960 at pages 2–69 et seq.

A feedback resistor 19 is connected between the output of amplifier 17 and the summing junction 15. Thus in the manner described in the foregoing text the gain of the amplifier 17 is equal to $$R19/R13 \quad (1)$$

where:

$R19$=resistance value of feedback resistor 19
$R13$=resistance value of input resistor 13

Figure 2:
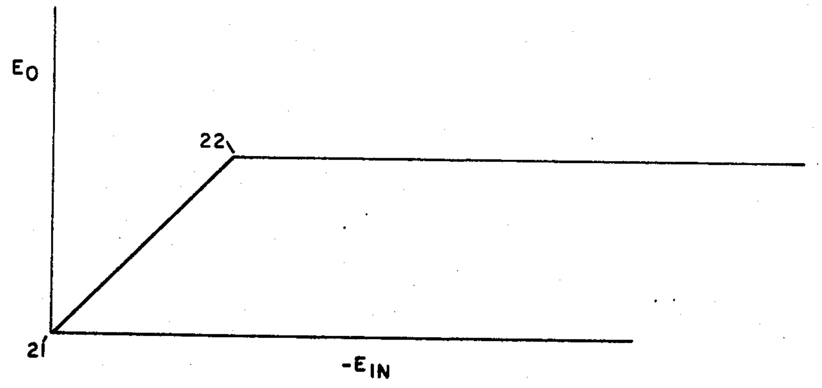
FIG. 2 is a graph helpful in explaining the operation of the circuit of FIG. 1.

If the resistance values of resistors 13 and 19 are equal then the gain of direct coupled amplifier 17 is equal to one. Accordingly, as the input voltage $E_{IN}$ increases, the positive-going output voltage $E_o$ also increases by an equal amount as illustrated in FIG. 2 between points 21 and 22.

In order to provide the limiting function of the invention there is provided a feedback limiter circuit 25 connected between the output terminal 11 and the summing junction 15. Circuit 25 includes a voltage divider network comprising resistors 26*a* and 26*b* with one end of the divider network connected to output terminal 11 and the other end of the divider connected to the movable arm of a limiting level potentiometer 28. The upper end of the resistance element of potentiometer 28 is connected to the negative side of a battery 29 and the other end is connected to the positive side of the battery and also to ground. The midpoint 26*c* of the voltage divider which is the junction of resistors 26*a* and 26*b*, is connected to an input of a non-inverting voltage gain direct coupled amplifier 30. Amplifier 30 is of the transistorized type and has a low impedance output which is applied through a low valued current limiting resistor 31 and a limiter diode 33, to the summing junction 15. Voltage divider resistors 26*a* and 26*b* are selected to be of equal resistance value and the arm of potentiometer 28 is set to a desired negative potential limiting level with respect to the positive going output potential $E_o$. The value of resistors 26*a* and 26*b* is determined by the current flow from the output 11 of amplifier 17. Resistor 26*a* cannot be selected to have too small a value or there will be an excessive current demand on amplifier 17. In a typical example resistor 26*a* may be 10,000 ohms.

In the example shown in FIG. 2, for values of output voltage $E_o$ below the limiting value indicated by the reference character 22, diode 33 is turned OFF. Diode 33 is turned OFF since below the limiting value 22 the magnitude of the positive-going output voltage $E_o$ is less than the negative potential produced at the movable arm of potentiometer 28. Thus the potential at the junction 26*c* is negative thereby maintaining diode 33 turned OFF.

With diode 33 turned OFF no current flows through the feedback limiter circuit 25 and thus $I_L$ equals zero. The remaining currents at the summing junction are conventionally defined as $$I_{IN}=I_f \tag{2}$$

In this manner the operational amplifier operates normally with a gain of one as shown in FIG. 2. When the magnitude of the output voltage $E_o$ reaches the limiting value indicated by the reference character 22 as determined by the setting of the potentiometer 28, then the diode 33 is turned ON. At that time an additional negative feedback circuit is provided in parallel with the feedback resistor 19 and the currents at the feedback circuit may be defined as $$I_{IN}=I_f+I_L \tag{3}$$

Figure 1A:
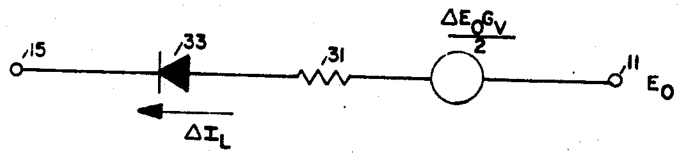

With diode 33 turned ON the feedback limiter circuit 25 provides substantially zero impedance in shunt with feedback resistor 19 to produce an overall negative feedback for amplifier 17 substantially equal to zero. The zero impedance of feedback circuit 25 is provided even though the circuit includes a series connected voltage divider resistor 26*a* for the reason that can best be explained by considering the equivalent circuit of FIG. 1*a*. In FIG. 1*a* as a result of the amplification provided by amplifier 30 the equivalent voltage source provides a voltage equal to $$\Delta E_o G_v/2 \tag{4}$$

where $G_v$=the voltage gain of amplifier 30.

With the foregoing voltage source the change in current through the feedback limiter circuit 25 may be expressed $$\Delta I_L=\frac{\frac{\Delta E_o G_v}{2}}{R31+R_D}=\frac{\Delta E_o G_v}{2(R31)+2R_D} \tag{5}$$

where $R_D$=resistance value of diode 33 turned ON.

The total value of the resistance of the feedback limiter circuit 25 may then be defined as $$R_1=\frac{\Delta E_o}{\Delta I_L}=\frac{2R31+2R_D}{G_v} \tag{6}$$

where $R_1$=total dynamic resistance of feedback limiter circuit 25.

As previously described the value of current limiting resistor 31 is substantially small and it will be understood that the resistance value of diode 33 turned ON is also substantially small, as for example 100 ohms. Thus in a typical example the value of the numerator of Equation 6 may be approximately 600. With regard to the denominator, the value of the voltage gain of amplifier 30 may be approximately 1,000 in a typical example. Accordingly, as a result of the amplification provided by amplifier 30 the value of the resistance $R_1$ will be 0.6 ohm which for practical purposes may be considered as substantially equal to zero as a limit.

In accordance with the invention with the valve of $R_1$ having a value of zero as a limit, the effective feedback resistance of amplifier 17 which comprises $R_1$ in shunt with feedback resistor 19 is substantially equal to zero. Thus the gain of amplifier 17 approaches zero as a limit since the slope of the gain curve is equal to the total feedback resistance divided by the value of the input resistor 13. Accordingly, with the total feedback resistance approaching zero the gain curve slope of amplifier 17 is substantially equal to zero as a limit as shown in FIG. 2 at values above the limiting value 22.

Thus in accordance with the invention even with the use of resistors 26*a* and 26*b* each having a substantial resistance value to prevent an excessive current demand on amplifier 17, there is provided an effective value of feedback impedance substantially equal to zero. In the prior art amplifier 30 is not provided and the effective impedance of the limiter circuit 25 is of a substantially higher resistance value as shown by the equivalent circuit of FIG. 1B. In accordance with this equivalent circuit, the change in the current through the feedback limiter circuit may be expressed as $$\Delta I_L=\frac{\frac{\Delta E_o}{2}}{R26a+2R_D} \tag{7}$$

where $R26a$=resistance value of resistor 26*a*.

Thus, the expression for the resistance of the feedback limiter circuit may then be defined $$R_1=\frac{\Delta E_o}{\Delta I_L}=R26a+2R_D \tag{8}$$

As previously described, resistor 26*a* may have a resistance value of 10,000 ohms. Thus the total value of the resistance of the feedback circuit $R_1$ is a substantial value when diode 33 is turned ON. Accordingly, the total effective feedback resistance value for amplifier 17 will be much greater than zero so that the slope of the gain curve is a finite value and in this way decreasing the accuracy of the limiter. In other words, in prior limiter circuits as the input voltage increases the output voltage also will be increased by a substantial amount above the limiting value 22.

An additional problem in prior limiters has been that the limiter diode 33 does not achieve its low turn ON resistance value, as for example 100 ohms, until its turn ON potential has increased beyond a predetermined level. That level is determined by the current v. voltage curve of the diode which, as well understood by those skilled in the art, has a "knee" below a predetermined potential as for example 0.4 volt for a general purpose switching diode. Thus below the knee the resistance of the turned ON diode is of substantial magnitude while above the diode resistance is at its substantially low level.

Figure 1B:
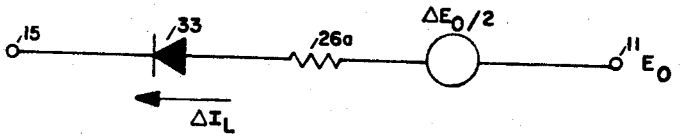

In prior limiters the voltage applied to the limiter diode is shown by the equivalent circuit of FIG. 1B to be $\Delta E_0/2$. Thus for values of $\Delta E_0/2$ less than 0.4 volt, the value of $R_1$ as defined in Equation 8 is a substantially large magnitude. The value of $R_1$ decreases to its above defined value when $\Delta E_0/2$ increases above 0.4 volt, viz, $\Delta E_0$ is greater than 0.8 volt. Accordingly, before the value of $E_0$ reaches 0.8 volt, prior art limiters provided a very soft limit in that the curve of the type shown in FIG. 2 was substantially rounded about the limit point 22.

On the other hand in accordance with the invention it will be seen that the voltage applied to diode 33 as shown by the equivalent circuit in FIG. 1A is $$\Delta E_0 G_V/2 \tag{9}$$

It will be understood that in order to apply to the diode a potential above the knee of the curve, as for example 0.4 volt, the value of $\Delta E_0$ must be equal to or greater than $$\Delta E_0 = 0.8/G_V \tag{10}$$

If the value of the voltage gain $G_V$ is approximately 1,000 then a value of $\Delta E_0$ of only 800 microvolts is necessary to bring the potential of diode 33 to the knee of the current v. voltage curve. Thus a very small change of $\Delta E_0$ is only necessary before the substantially small value of effective limiter resistance of Equation 6 is provided. In this manner the limiter of the invention provides a "hard" limit at the limiting value 22 as shown in FIG. 2.

Amplifier 30 is a direct coupled amplifier providing voltage gain to the D.C. signal and has slow frequency response in order to provide closed loop stability for the limiter circuit of FIG. 1. In this manner the limiter circuit of the invention is stable for D.C. signals. However, if high frequency signals are also applied to the limiter circuit there is required an additional feedback limiter circuit to limit such high frequency signals. Accordingly as shown in FIG. 3 an additional feedback limiter circuit is provided to that shown in FIG. 1 with similar elements being indicated by similar reference characters.

Figure 3:
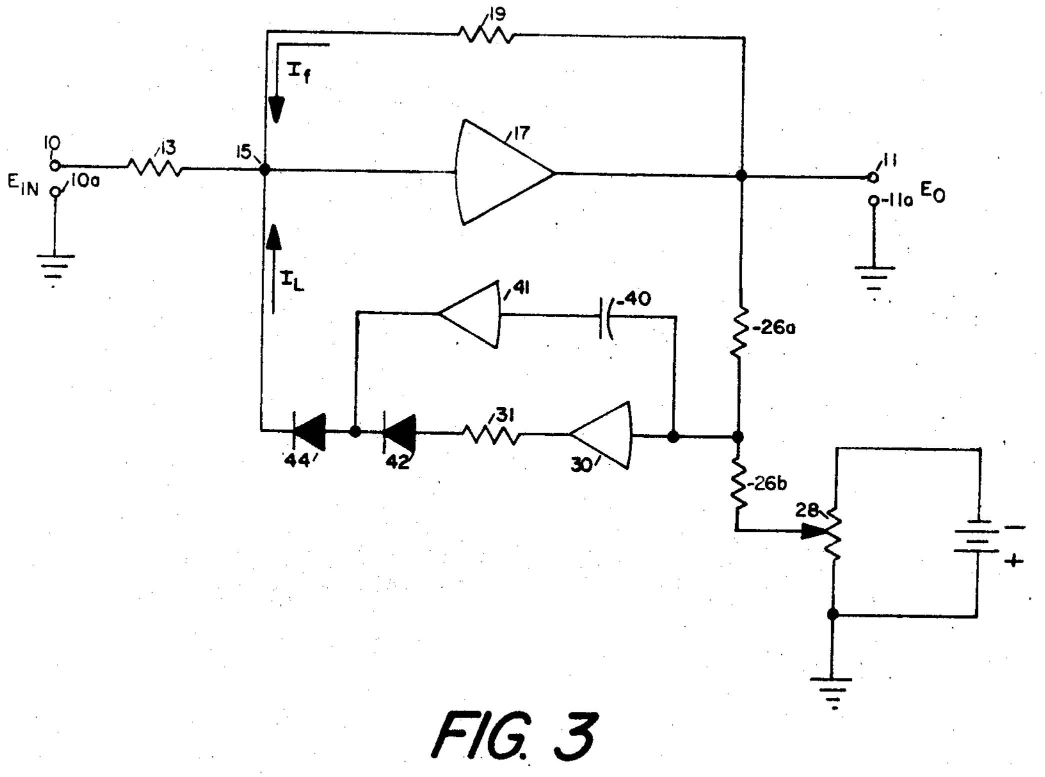
FIG. 3 schematically illustrates another embodiment of the invention.

Thus, as shown in FIG. 3 a high frequency feedback limiter circuit is connected by way of the input of amplifier 30, a capacitor 40, an A.C. amplifier 41, a limiter diode 44 and then to the junction 15. The D.C. feedback limiter circuit then comprises amplifier 30, resistor 31, a limiter diode 42 and the common limiter diode 44. By the use of an A.C. amplifier 41 having a gain of one, the stability problems are avoided. However as a result of the low amplification of amplifier 41 the limiter curve of the type shown in FIG. 2 for the high frequencies will have a substantial slope before the knee of the diode current v. voltage curve. After the knee of the diode current v. voltage curve, the limiter curve will have a finite slope. Thus the limiter for the high frequencies may be considered a "soft" limiter, with the D.C. signals having a "hard" limit.

It will be understood that the limiter circuit of the present invention may be used not only for a basic limiter application but also for other purposes. Specifically in a sine function generator it is understood that one of the slopes of the curve being generated requires a zero slope line, viz 0=90°. Thus the limiter circuit provides such a zero slope signal and may be used to generate such zero slope signal.

Modifications of this invention not described herein will be apparent to those skilled in the art and it is intended that the matter contained in the foregoing description be interpreted as illustrative and not limited, the scope of the invention being defined in the appended claims.

What is claimed is:

1. A circuit having an input signal applied to an input terminal thereof for producing an output signal at an output terminal thereof in which as the input signal increases in magnitude the output signal correspondingly increases in magnitude until a predetermined limiting value comprising:

a direct coupled multistage operational amplifier connected between said input and output terminals and including an input resistor connected between said input terminal and an input of said amplifier, a feedback resistor directly connected between said output terminal and said amplifier input to provide a nonreactive resistance feedback path, and a feedback limiter circuit including in series circuit resistance means, a voltage gain amplifier and a limiter diode connected between said output terminal and said amplifier input, source means connected to said limiter circuit for setting the level of said predetermined limiting valve thereby to turn OFF said diode when said output voltage is below said predetermined limiting value and to turn ON said diode when said output voltage reaches said limiting value whereby with said diode turned ON the impedance of said feedback circuit reduces in value to zero as a limit to provide a gain for said direct coupled amplifier which approaches zero as a limit to prevent said output voltage from increasing.

2. The circuit of claim 1 in which there is provided a resistor connected between the output of said voltage gain amplifier and said limiter diode and having a low value of resistance to provide for current limiting.

3. A limiter circuit for preventing an output voltage at an output terminal from increasing beyond a predetermined limiting value as the input voltage applied to an input terminal increases in value comprising:

a direct coupled amplifier connected between said input and output terminals, an input impedance connected between said input terminal and an input of said direct coupled amplifier, a feedback impedance connected between said output terminal and said amplifier input, and a feedback limiter circuit including in series circuit relation voltage divider means, a voltage gain amplifier, and a limiter diode connected between said output terminal and said amplifier input, said voltage divider means comprising two voltage divider resistors connected in series circuit having one end of said series circuit connected to said output terminal and having a common point of said resistors connected to an input of said voltage gain amplifier whereby when said output voltage is below said limiting value said diode is turned OFF so that said feedback impedance comprises the only feedback element for said direct coupled amplifier and at said limiting value said device is turned ON reducing to zero as a limit the effective feedback impedance of said direct coupled amplifier.

4. A limiter circuit for preventing an output voltage at an output terminal from increasing beyond a predetermined limiting value as the input voltage applied to an input terminal increases in value comprising:

a direct coupled amplifier connected between said input and output terminals, an input impedance connected between said input terminal and an input of said direct coupled amplifier, a feedback impedance connected between said output terminal and said amplifier input, a feedback limiter circuit including in series circuit relation voltage divider means, a voltage gain amplifier, and a limiter diode connected between said output terminal and said amplifier input whereby when said output voltage is below said limiting value said diode is turned OFF so that said feedback impedance comprises the only feedback element for said direct coupled amplifier and at said limiting value said device is turned ON reducing to zero as a limit the effective feedback impedance of said direct coupled amplifier, and an additional feedback circuit connected between an input of said voltage gain amplifier and said amplifier input and including an A.C. amplifier for providing a path for high frequency signals applied to said input terminal.

5. The limiter circuit of claim 4 in which said additional feedback circuit includes a capacitor connected in series circuit with said A.C. amplifier and in which said series circuit is connected between said input of said voltage gain amplifier and the side of said limiter diode remote from said voltage gain amplifier, and an additional limiter diode connected between said last named side of said limiter diode and said amplifier input, said A.C. amplifier having a substantially low value of gain and providing a path for high frequency signals.

6. A circuit having an input signal applied to an input terminal thereof for producing an output signal at an output terminal thereof in which as the input signal increases in magnitude the output signal correspondingly increases in magnitude until a predetermined limiting value comprising:

a direct coupled operational amplifier connected between said input and output terminals and including an input resistor connected between said input terminal and an input of said direct coupled amplifier, a feedback resistor connected between said output terminal and said direct coupled amplifier input, a feedback limiter circuit including in series circuit a voltage divider, a voltage gain amplifier and a limiter diode connected between said output terminal and said direct coupled amplifier input, said voltage divider having one end connected to said output terminal and a center tap connected to an input of said voltage gain amplifier, and variable source means connected to the other end of said voltage divider for setting the level of said predetermined limiting value thereby to turn OFF said diode when said output voltage is below said predetermined limiting value and to turn ON said diode when said output voltage reaches said limiting value whereby with said diode turned ON the impedance of said feedback circuit reduces in value to zero as a limit to provide a gain for said direct coupled amplifier which approaches zero as a limit to prevent said output voltage from increasing.

7. A circuit having an input signal applied to an input terminal thereof for producing an output signal at an output terminal thereof in which as the input signal increases in magnitude the output signal correspondingly increases in magnitude until a predetermined limiting value comprising:

a direct coupled operational amplifier connected between said input and output terminals and including an input resistor connected between said input terminal and an input of said direct coupled amplifier, a feedback resistor connected between said output terminal and said direct coupled amplifier input, a feedback limiter circuit including in series circuit a voltage divider, a voltage gain amplifier and a limiter diode connected between said output terminal and said direct coupled amplifier input to turn OFF said diode when said output voltage is below said predetermined limiting value and to turn ON said diode when said output voltage reaches said limiting value whereby with said diode turned ON the impedance of said feedback circuit reduces in value to zero as a limit to provide a gain for said direct coupled amplifier which approaches zero as a limit to prevent said output voltage from increasing, and an additional feedback circuit connected between an input of said voltage gain amplifier and said direct coupled amplifier input and including an A.C. amplifier for providing a limiting circuit for high frequency signals applied to said input terminal.

8. The circuit of claim 1 in which said additional feedback circuit includes a capacitor connected in series circuit relation with said A.C. amplifier with said series circuit being connected between said input of said voltage gain amplifier and the side of said limiter diode remote from said voltage gain amplifier, and in which there is provided an additional limiter diode connected between said last named side of said limiter diode and said amplifier input whereby there is provided a path for high frequency signals.

References Cited

UNITED STATES PATENTS

| | | | |
|---|---|---|---|
| 3,094,675 | 6/1963 | Ule | 307—88.5 X |
| 3,098,199 | 7/1963 | Carney et al. | 330—110 X |
| 3,153,152 | 10/1964 | Hoffman | 307—88.5 |
| 3,167,718 | 1/1965 | Davis | 328—127 |
| 3,225,304 | 12/1965 | Richards | 330—110 X |

JOHN S. HEYMAN, *Primary Examiner.*

ARTHUR GAUSS, *Examiner.*

J. A. JORDAN, S. D. MILLER, *Assistant Examiners.*